(12) United States Patent
Itsuji

(10) Patent No.: US 11,940,323 B2
(45) Date of Patent: Mar. 26, 2024

(54) ELECTROMAGNETIC WAVE MODULE AND ELECTROMAGNETIC WAVE CAMERA SYSTEM USING THE SAME

(71) Applicant: CANON KABUSHIKI KAISHA, Tokyo (JP)

(72) Inventor: Takeaki Itsuji, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 322 days.

(21) Appl. No.: 17/531,606

(22) Filed: Nov. 19, 2021

(65) Prior Publication Data

US 2022/0170785 A1     Jun. 2, 2022

(30) Foreign Application Priority Data

Nov. 30, 2020     (JP) .................... 2020-198281

(51) Int. Cl.
| | |
|---|---|
| *G01J 1/44* | (2006.01) |
| *G01J 1/02* | (2006.01) |
| *G01J 1/04* | (2006.01) |
| *H01L 31/0232* | (2014.01) |
| *H01L 31/024* | (2014.01) |
| *H01L 33/58* | (2010.01) |
| *H01L 33/64* | (2010.01) |

(52) U.S. Cl.
CPC .............. *G01J 1/44* (2013.01); *G01J 1/0252* (2013.01); *G01J 1/0411* (2013.01); *G01J 1/0422* (2013.01); *H01L 31/02327* (2013.01); *H01L 31/024* (2013.01); *H01L 33/58* (2013.01); *H01L 33/644* (2013.01); *G01J 2001/4466* (2013.01)

(58) Field of Classification Search
CPC ...... G01J 1/0252; G01J 1/0411; G01J 1/0422; G01J 1/44; G01J 2001/4466; H01L 31/02327; H01L 31/024; H01L 33/58; H01L 33/644
See application file for complete search history.

(56) References Cited

U.S. PATENT DOCUMENTS

| | | | |
|---|---|---|---|
| 9,671,099 B2 * | 6/2017 | Park .................. | F21V 5/045 |
| 11,569,184 B2 * | 1/2023 | Tsuruda ............. | H01Q 19/13 |
| 2015/0194542 A1 * | 7/2015 | Baik .................. | H01L 31/02327 |
| | | | 257/432 |

(Continued)

FOREIGN PATENT DOCUMENTS

| | | | | |
|---|---|---|---|---|
| CN | 107068783 B | * | 8/2018 | ....... H01L 31/02327 |
| JP | 2014200065 A | | 10/2014 | |

(Continued)

*Primary Examiner* — Mark R Gaworecki
(74) *Attorney, Agent, or Firm* — Canon U.S.A., Inc. IP Division

(57) ABSTRACT

An electromagnetic wave module comprising a chip and a lens unit. The chip has a first face, a second face opposed to the first face, and a third face connecting the first face and the second face. The lens unit has a curved face forming a lens, a fourth face opposed to the curved face, and a recessed portion encompassed in an outer edge of the curved face on a projected plane in an optical axis of the lens. The recessed portion has a fifth face disposed at a position closer to the curved face than the fourth face, and a sixth face connecting the fifth face and the fourth face. At least a part of the sixth face of the recessed portion is in contact with at least a part of the third face of the chip.

16 Claims, 10 Drawing Sheets

(56) References Cited

U.S. PATENT DOCUMENTS

| | | | | |
|---|---|---|---|---|
| 2018/0315898 A1* | 11/2018 | Chen | ........................ | H01L 33/64 |
| 2020/0318812 A1* | 10/2020 | Spinella | .................. | F21V 14/00 |
| 2021/0265539 A1* | 8/2021 | Park | ........................ | H01L 33/58 |

FOREIGN PATENT DOCUMENTS

| | | | |
|---|---|---|---|
| JP | 2015188174 A | | 10/2015 |
| JP | 2016033886 A | | 3/2016 |
| JP | 2018087725 A | | 6/2018 |
| JP | 2019193042 A | | 10/2019 |

\* cited by examiner

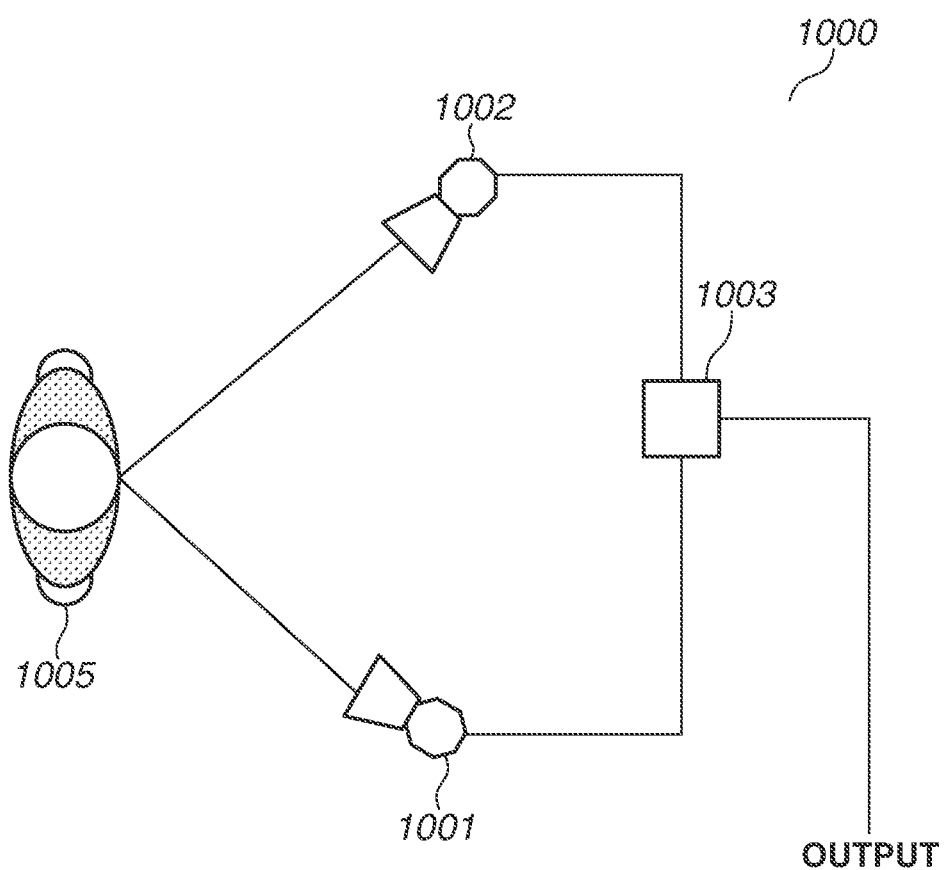

ELECTROMAGNETIC WAVE MODULE AND ELECTROMAGNETIC WAVE CAMERA SYSTEM USING THE SAME

BACKGROUND

Field

The present disclosure relates to an electromagnetic wave module and an electromagnetic wave camera system using the electromagnetic wave module.

Description of the Related Art

Terahertz waves are typically electromagnetic waves having signals in the optional frequency band in the range from 0.2 THz to 30 THz. A terahertz wave has a long wavelength compared with visible light and infrared light, which is less susceptible to scattering waves from objects and has a high transmission property to many substances. Further, the terahertz wave provides a high spatial resolution as its wave length shorter than that of the millimeter wave. These properties are expected to be used in safe imaging technology as a replacement of X-rays. For example, they are expected to be applied to hidden object inspection technology used in body check at public sites and for monitoring cameras.

Japanese Patent Application Laid-Open No. 2018-087725 discusses an active camera system including a lighting unit emitting terahertz waves as an imaging technique using terahertz waves. Japanese Patent Application Laid-Open No. 2018-087725 discusses a generating unit generating terahertz waves and an irradiation optical system provided for the generating unit.

SUMMARY

According to various embodiments of the present disclosure, an electromagnetic wave module comprising a chip and a lens unit. The chip has a first face, a second face opposed to the first face, and a third face connecting the first face and the second face. The chip at least includes an antenna electrode disposed on the first face, a reference portion disposed on the second face and configured to determine a reference potential, and a semiconductor portion disposed between the antenna electrode and the reference portion and configured to perform gain action or rectification action on electromagnetic waves. The lens unit has a curved face forming a lens, a fourth face opposed to the curved face, and a recessed portion encompassed in an outer edge of the curved face on a projected plane in an optical axis of the lens. The recessed portion has a fifth face disposed at a position closer to the curved face than the fourth face, and a sixth face connecting the fifth face and the fourth face. At least a part of the sixth face of the recessed portion is in contact with at least a part of the third face of the chip.

Further features of the present disclosure will become apparent from the following description of example embodiments with reference to the attached drawings.

BRIEF DESCRIPTION OF THE DRAWINGS

FIG. 10 is a schematic diagram illustrating a terahertz wave camera system.

DESCRIPTION OF THE EMBODIMENTS

Some example embodiments of the present disclosure will be described below. In the example embodiments, electromagnetic waves are terahertz waves, but electromagnetic waves other than the terahertz waves are applicable.

The terahertz waves in the example embodiments typically have frequencies in the range from 0.2 THz to 30 THz, more suitably in the range from 0.3 THz to 10 THz. In the following description, an electromagnetic wave module using a device transmitting electromagnetic waves will be described; however, an electromagnetic wave module using a device detecting electromagnetic waves is also applicable. Further, the example embodiments can be appropriately modified and combined.

An aspect of the example embodiments described below comes from detailed studies about modularization of a chip serving as a generation unit of terahertz waves and an illumination optical system. Further, the studies were conducted taking consideration that low positional accuracy between the optical system and the electromagnetic wave chip may deteriorate characteristics of the electromagnetic wave module. Moreover, the example embodiments described below are directed to an electromagnetic wave module with high positional accuracy between the electromagnetic wave chip and the optical system. Hereinafter, the expression "the plane" may include surface, and interface, etc.

Figure 1A:
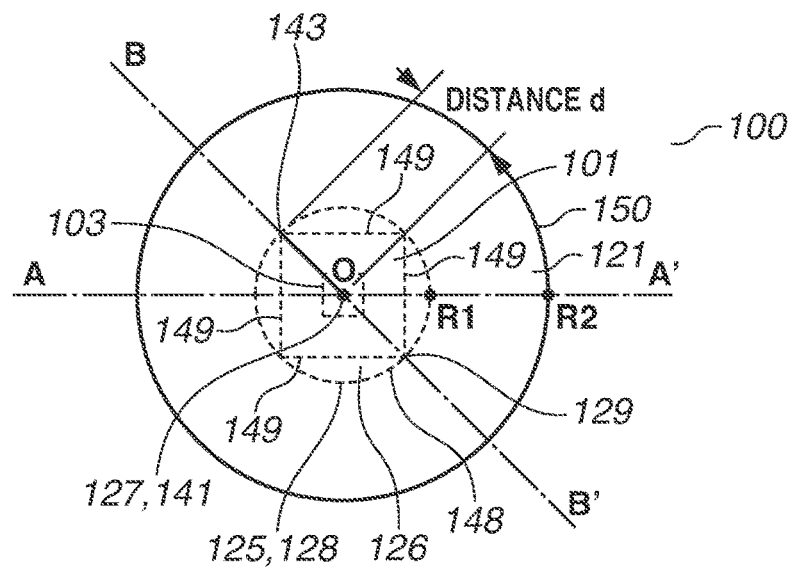
FIG. 1A is a schematic plan view illustrating the configuration of an electromagnetic wave module according to a first example embodiment.
Figure 1B:
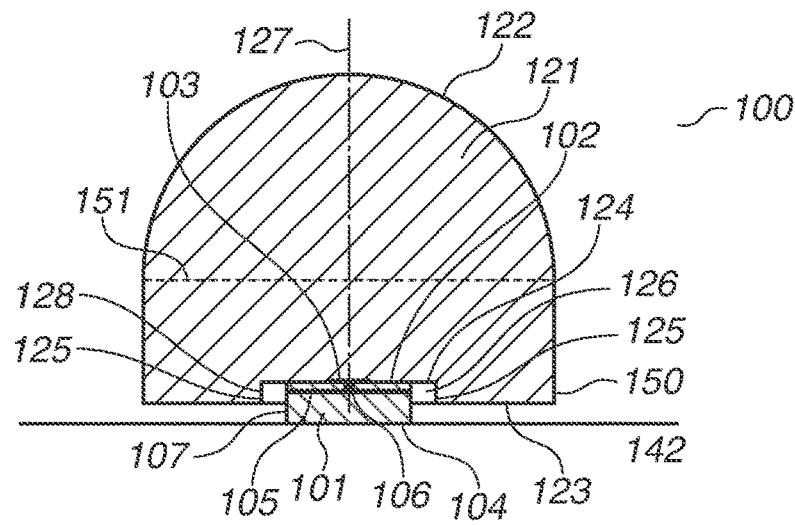
FIG. 1B is a schematic cross-sectional view illustrating the configuration of the electromagnetic wave module according to the first example embodiment.
Figure 1C:
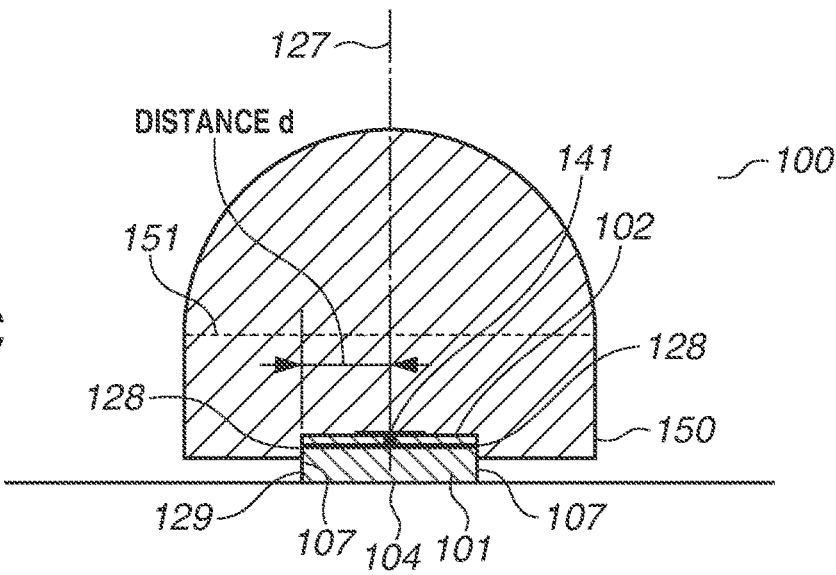
FIG. 1C is a schematic cross-sectional view illustrating the configuration of the electromagnetic wave module according to the first example embodiment.

An electromagnetic wave module according to a first example embodiment will be described with reference to FIGS. 1A to 1C. FIG. 1A is a schematic plan view illustrating the configuration of an electromagnetic wave module 100 according to the present example embodiment. FIG. 1B is a schematic cross-sectional view taken along line AA' in FIG. 1A, illustrating the configuration of the electromagnetic wave module 100 according to the present example embodiment. FIG. 1C is a schematic cross-sectional view taken along line BB' in FIG. 1A, illustrating the configuration of the electromagnetic wave module 100 according to the present example embodiment. The cross-sections in FIGS. 1B and 1C include an optical axis 127 of a lens. The following is a description with reference to FIGS. 1A to 1C. The electromagnetic wave module 100 according to the present example embodiment includes a chip 101 and a lens unit 121 disposed for the chip 101. The electromagnetic wave module 100 may further include a substrate 142 on which the chip 101 is mounted.

The chip 101 includes a device generating or detecting electromagnetic waves. The device in the chip 101 includes an antenna generating or detecting electromagnetic waves. In the present example embodiment, the electromagnetic waves are terahertz waves. The chip 101 may include a plurality of antennae. For example, the antenna includes an antenna electrode 103. A technique is applicable that provides an improved directivity and a higher front intensity of terahertz waves with synchronized phases of a plurality of antenna with their antenna electrodes 103 arranged in an array. As the device is applicable to applications in generation and detection of the electromagnetic waves as described above, in directivity adjustment using the antennae, the devices are applicable to applications in both generation and detection of the electromagnetic waves.

The lens unit 121 can adjust the beam shape of electromagnetic waves generated from the chip 101 or of electromagnetic waves reaching the chip 101. Further, the lens unit 121 can adjust the directivity of electromagnetic waves generated from the chip 101 or of electromagnetic waves reaching the chip 101.

Further, the lens unit 121 can converge or diverge electromagnetic waves generated from the chip 101 or electromagnetic waves reaching the chip 101.

As illustrated in FIGS. 1B and 1C, the lens unit 121 has a curved face 122. The curved face 122 can function as a lens. The curved face 122 has a semicircular shape; however, the shape of the curved face 122 is not limited thereto. The lens unit 121 includes a recessed portion 126. As illustrated in FIGS. 1B and 1C, the recessed portion 126 is positioned between the curved face 122 and a counter face 123. As illustrated in FIG. 1A, the recessed portion 126 is positioned inside an outer edge 150 of the lens unit 121. Further, as illustrated in FIG. 1A, the recessed portion 126 is encompassed in the outer edge 150 of the lens unit 121. FIG. 1A is also a projected view in the optical axis 127 of the lens of the curved face 122. In the present example embodiment, the planar shape of the recessed portion 126 is a circle as illustrated in FIG. 1A. In the present example embodiment, as illustrated in FIG. 1A, the outer edge of the recessed portion 126 and the outer edge 150 of the lens unit 121 are concentric with the optical axis 127 as the center; however, the configuration is not limited thereto. Further, in the present example embodiment, the outer edge of the recessed portion 126 in FIG. 1A is a side face 125 of the recessed portion 126. The chip 101 is encompassed in the recessed portion 126. Such a configuration provides the electromagnetic wave module equipped with the optical system and the chip.

Further, a positional relationship between the chip 101 and the lens unit 121 will be described. Faces 107 as side faces of the chip 101 and the face 125 as the side face of the recessed portion 126 are in partial contact with each other. Putting the faces 107 and the face 125 in contact with each other makes it possible to position the optical axis 127 of the lens unit 121 and the chip 101. In other words, the contact positioning in the process of mounting the lens unit 121 and the chip 101 puts the lens unit 121 and the chip 101 in place.

The configuration allows the mounting of the lens unit 121 and the chip 101 with less deviation of the optical axis. Further, the positioning inside the curved face 122 of the lens unit 121 facilitates downsizing of the electromagnetic wave module compared with the positioning by a positioning mechanism provided outside the lens unit 121.

The following will describe in detail.

FIG. 1A is a schematic plan view illustrating the configuration of the electromagnetic wave module 100 according to the present example embodiment. The chip 101 has a rectangular shape in a planar view, and has a square shape in the present example embodiment.

The chip 101 has an outer edge 149 with four sides; however, the chip 101 is not limited thereto. The center of the chip 101 and a point O are at the same place. The diagonal length of the chip 101 is distance d×2. The chip 101 includes the device, and the antenna electrode 103 of the device is illustrated. The center of the antenna electrode 103 and the point O are at the same place. In the present example embodiment, terahertz waves are generated from the center of the antenna electrode 103. The lens unit 121 has the outer edge 150 in a circle with a radius R2 in a planar view. Further, the lens unit 121 includes the recessed portion 126 having an outer edge 148 with a radius R1. Both outer edges are circles with the point O as their centers. The recessed portion 126 is encompassed in the outer edge 150.

The distance d×2 as the diagonal length of the chip 101 is equal to the radius R1×2 as the diameter of the recessed portion 126. In other words, the four corners of the chip 101 and the outer edge 148 of the recessed portion 126 are in contact with each other. Such an arrangement allows the positioning of the chip 101 and the lens unit 121 with high accuracy.

At least a part of the outer edge 148 of the recessed portion 126 functions as a first positioning portion 128.

At least a part of the outer edge 149 of the chip 101 functions as a second positioning portion 129. In the present example embodiment, the corners of the outer edge 149 of the chip 101 function as the second positioning portions 129. At least one second positioning portion 129 is enough. At least one second positioning portion 129 allows positioning. More suitably, two or more second positioning portions 129 are provided. That allows the positioning with higher accuracy. The whole of the outer edge 148 may function as the positioning portion, and the whole of the outer edge 149 may function as the positioning portion.

In FIG. 1A, it is suitable that the point O, the optical axis 127 of the lens of the lens unit 121, and a position 141 where terahertz waves are generated from the chip 101 are at the same place. The position 141 may be a center where the generated terahertz waves are combined. Those points may not be completely at the same place. Further, if the position 141 is not a point but has an area, it is sufficient for the position 141 to at least partially overlap with the point O.

FIG. 1B is a schematic cross-sectional view taken along line AA' in FIG. 1A. FIG. 1C is a schematic cross-sectional view taken along line BB' in FIG. 1A. The chip 101 has a face 102, a face 104, and the faces 107. The face 102 and the face 104 are opposed to each other. In other words, the face 102 is the top face, the face 104 is the bottom face, and the faces 107 are the side faces connecting the face 102 and the face 104. For example, the face 102 is also referred to as a first face, the face 104 is also referred to as a second face, and the faces 107 are also referred to as third faces. The chip 101 according to the present example embodiment has four faces 107; however, the number of faces 107 is not limited thereto. The chip 101 may have three faces 107 or five or more faces 107. The chip 101 includes the device. In this case, the outer edge 149 of the chip 101 in FIG. 1A is the faces 107.

The device includes the antenna. The antenna includes the antenna electrode 103, a reference portion 105, and a semiconductor portion 106. The antenna electrode 103 is a conductor disposed on the face 102 of the chip 101. The reference portion 105 is a conductor disposed on the face 104 of the chip 101, and supplies a reference potential. The semiconductor portion 106 is positioned between the antenna electrode 103 and the reference portion 105, and is made of a semiconductor. The device according to the present example embodiment emits terahertz waves, for example. The directivity of terahertz waves is adjusted to the direction from the reference portion 105 toward the antenna electrode 103 by the reference portion 105. As the device according to the present example embodiment includes one antenna electrode 103, the position 141 where terahertz waves are generated is positioned at the center of the antenna electrode 103. The center is a center in a planar view or is the position of the semiconductor portion 106. The device of the chip 101 is fabricated using a gallium arsenide (GaAs)-based compound semiconductor, an indium phosphide (InP)-based compound semiconductor, a silicon semiconductor, or the like as the base. In other words, the chip 101 includes the antenna electrode 103 disposed on the first face, and the reference portion 105 disposed on the second face to determine a reference potential, at least. Further, the chip 101 includes the semiconductor portion 106 disposed between the antenna electrode 103 and the reference portion 105 to perform gain or rectification action on electromagnetic waves, at least.

The semiconductor portion 106 performs gain action or rectification action on desired electromagnetic waves. For example, with the semiconductor portion 106 to perform gain action on terahertz waves, the electromagnetic wave module 100 serves as a terahertz wave generation module. With the semiconductor portion 106 to perform rectification action on terahertz waves, the electromagnetic wave module 100 serves as a terahertz wave detection module.

The semiconductor portion 106 to perform gain action on terahertz waves is as follows. The semiconductor portion 106 is a negative resistance device such as a resonant tunneling diode (hereinafter, RTD), a Gunn diode, or an impact ionization avalanche transit-time (IMPATT) diode as applicable examples. The semiconductor portion 106 to perform rectification action on terahertz waves is as follows. The semiconductor portion 106 is a Schottky barrier diode (hereinafter, SBD), a self-switching diode, or a metal-insulator-metal (MIM) diode as applicable examples. An SBD can be made of a compound semiconductor or a semiconductor.

In the present example embodiment, the device includes one antenna; however, the device may include a plurality of antennae. In that case, the antennae can include the reference portion 105 common to the antennae. That configuration uses characteristics of radio waves in the range of terahertz waves to superimpose the terahertz waves generated from the antennae to adjust the entire directivity of the terahertz waves. For example, the antennae are arranged in an array. Synchronization of the phases of the terahertz waves generated from the individual antennae enables adjustment of the beam shape of the terahertz waves. More specifically, the array arrangement of antennae discussed in Japanese Patent Application Laid-Open No. 2014-200065 is used as means to control the directivity of the terahertz waves. The directivity tends to be improved with increase in the number of arrayed antennae. Controlling the phase difference between the terahertz waves generated from the adjacent antennae makes it possible to control the directivity of the beam of the terahertz waves. The position 141 where terahertz waves are generated is changed based on the arrangement pattern of the antenna electrodes 103 and the phase difference between the terahertz waves generated from the antennae. For example, the position 141 where terahertz waves are generated from the antenna electrodes 103 in a two-dimensional array with the phases of the terahertz waves synchronized with one another is at the center of the array area. The center is also regarded as a centroid in a planar view. In other words, synchronization of the phases of the terahertz waves generated from the antennae generates a point light source of the terahertz waves at the position 141 of the generated terahertz waves. The synchronization of the phases of the terahertz waves is not limited to a state where the phases agree with one another completely.

Compared with an example of an optical device such as light emitting diodes (LED), a plurality of LEDs in an array on an optical device forms a surface light source. The surface light source may also be referred to as an area light source. The unchanged directivity of light from each of the LEDs causes an expanded beam emitted from the LEDs. On the other hand, the terahertz wave beams from a plurality of antennae are adjusted in phases of the terahertz waves as described above to form a beam like a point light source, which means that the beam shape of terahertz waves is controllable. The point light source may also be referred to as a spot light source.

The lens unit 121 has a shape in which the columnar portion and the hemispherical portion are integrated at a virtual line 151. The lens unit 121 has the curved face 122 serving as the lens, the face 123 opposed to the curved face 122, and the recessed portion 126. In other words, the curved face 122 is the top face, and the face 123 is the bottom face. The recessed portion 126 includes a face 124 nearer the curved face 122, the face 123 opposed to the face 124, and the face 125 connecting the face 124 and the face 123. The face 123 is positioned between the face 124 and the curved face 122. The recessed portion 126 has a columnar shape, and the face 125 is a curved face. The recessed portion 126 is encompassed inside the outer edge of the curved face 122 in a projected view in the optical axis 127 of the lens. The face 123 is also referred to as a fourth face, the face 124 is also referred to as a fifth face, and the face 125 is also referred to as a sixth face. The lens unit 121 has the curved face 122 serving as the lens, the fourth face opposed to the curved face 122, and the recessed portion 126 encompassed inside the outer edge of the curved face 122 in a projected view in the optical axis 127 of the lens. The recessed portion 126 has the fifth face disposed between the curved face 122 and the fourth face, and the sixth face connecting the fifth face and the fourth face.

The optical axis 127 of the lens can be located from a shape, a refractive index, and a position of the refractive index interface of the lens unit 121. It is suitable that the lens unit 121 is made of a material that will suffer a slight loss of terahertz waves. For example, a resin material such as polyolefin, Teflon®, and a high-density polyethylene can be used. Further, a semiconductor material such as a high-resistance silicon can be used. In various example embodiments of the present disclosure, these materials are collectively referred to as dielectric materials.

The positioning portions will be described in detail. As described with reference to FIG. 1A, the first positioning portion 128 is the outer edge 148 of the recessed portion 126. In FIGS. 1B and 1C, the outer edge 148 is the face 125 of the recessed portion 126. In other words, the first positioning portion 128 may be at least a part of the face 125 of the recessed portion 126. As described with reference to FIG. 1A, the second positioning portions 129 are at least a part of the outer edge 149 of the chip 101, and are the corners of the chip 101, for example. In FIGS. 1B and 1C, the outer edge 149 of the chip 101 is the faces 107 of the chip 101, and each of the corners of the chip 101 is formed by the intersection of two of the faces 107.

The first positioning portion 128 and each of the second positioning portions 129 are in at least point contact with each other. Further, in the present example embodiment, the first positioning portion 128 and each of the second positioning portions 129 are in line contact with each other. The first positioning portion 128 and each of the second positioning portions 129 are in point contact with each other at least a position 143 as illustrated in FIG. 1A, and are in line contact with each other as illustrated in FIG. 1C. In other words, at least a part of the face 125 of the recessed portion 126 are in contact with at least a part of the faces 107 of the chip 101. The face 125 here is also referred to as the sixth face, and the faces 107 are also referred to as the third faces. Such a method can position the lens unit 121 relative to the chip 101. Such contact points allows the mounting of the chip 101 and the lens unit 121 with high positional accuracy. In other words, in the electromagnetic wave module 100 according to the present example embodiment, the position 141 where terahertz waves are generated from the chip 101 and the optical axis 127 of the lens of the lens unit 121 can agree with each other.

The contact between the first positioning portion 128 and the second positioning portions 129 is not limited thereto. For example, the first positioning portion 128 and each of the second positioning portions 129 may be in face contact with each other. Further, in a planar view as illustrated in FIG. 1A, the first positioning portion 128 and each of the second positioning portions 129 may be in line contact with each other. Further, in a cross-sectional view as illustrated in FIG. 1C, the first positioning portion 128 and each of the second positioning portions 129 may be in point contact with each other.

As illustrated in FIG. 1A, as for each position 143 where the first positioning portion 128 and each of the second positioning portions 129 are in contact with each other, distances described below are equal to each other. A distance d between the first positioning portion 128 and the position 141 where terahertz waves are generated is equal to the radius R1, which is a distance between each of the second positioning portions 129 and the optical axis 127 of the lens. The condition allows the electromagnetic wave module 100 according to the present example embodiment to reduce positional deviation between the chip 101 and the lens unit 121 in at least in the in-plane direction perpendicular to the optical axis 127 of the lens in the mounting process. For example, that allows the reduction of positional deviation between the center of the chip 101 and the optical axis of the lens unit 121. The in-plane direction perpendicular to the optical axis 127 of the lens is also referred to as a horizontal direction.

The positioning accuracy will be described. For example, the chip 101 is cut out from a semiconductor wafer. The accuracy of cutting out a chip from a semiconductor waver typically ranges from about ten micron meters to about several hundred micron meters. The lens unit 121 is made of, for example, a dielectric material with about ten micron meters to about several hundred micron meters that is the accuracy of machining an outer shape. The positioning accuracy in the horizontal direction determined by contact ranges from several ten micron meters to several hundred micron meters based on the machining accuracy. The positional deviation in the horizontal direction refers to the positional deviation of the chip from the optical axis of the lens in the plane perpendicular to the optical axis of the lens.

Figure 9A:
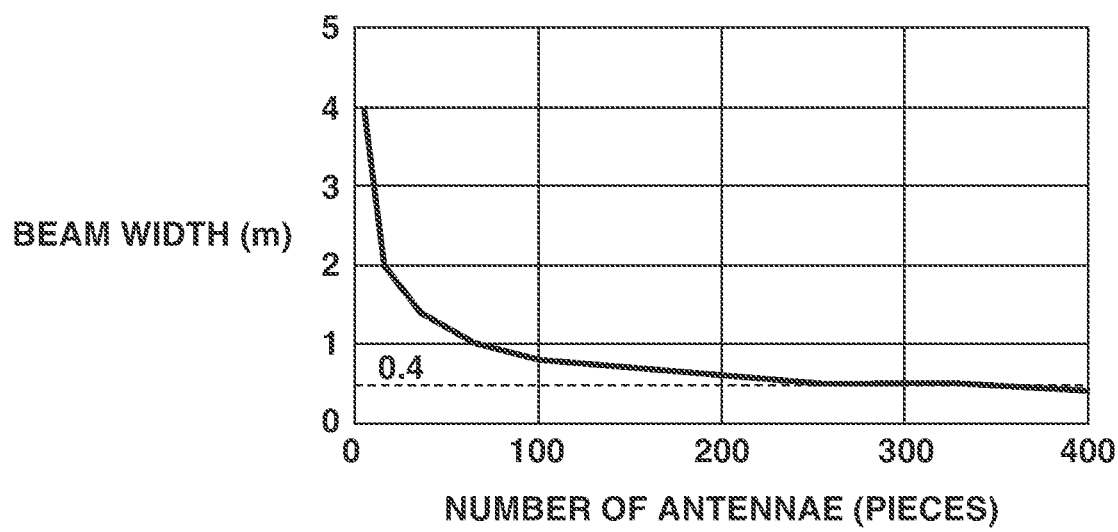
FIG. 9A is a graph illustrating a relationship between the number of antennae and a beam width.

The directivity of terahertz waves will be described with reference to FIGS. 9A and 9B. FIG. 9A is a graph illustrating a relationship between the number of antennae of the device and beam widths (m) at five meters ahead. The graph is obtained from calculation under the condition that the antennae are arranged in a lattice and the phases of the antennae are synchronized with one another. The relationship shows the relationship between the number of antennae and the directivity. The graph shows that the beam width is reduced as the number of antennae arranged in an array increases. Further, it is found that the reduction rate of the beam width to the increase in the number of antennae comes to fall slowly. In other words, the improved width of the directivity with the increase in the number of antennae tends to level off. More specifically, the beam width of terahertz waves is exponentially reduced with the increase in the number of antennae, and then levels off to about 0.4 m at five meters ahead in the range of the number of antennae from 100 to 200. In other words, the beam width at five meters ahead goes to 0.4 m. The 0.4 m width is an average lateral width of a person, for example.

Figure 9B:
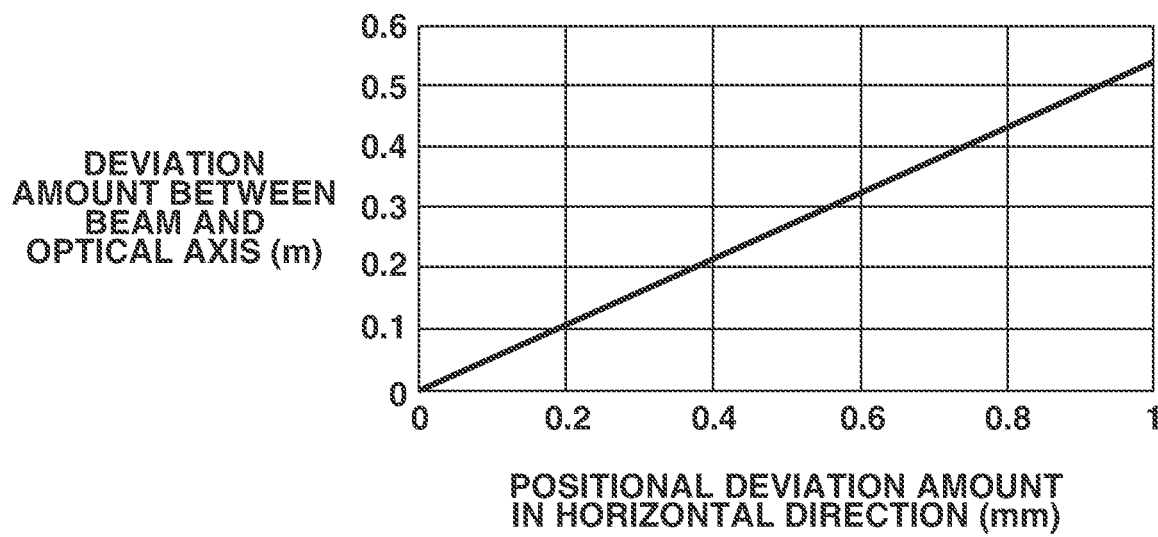
FIG. 9B is a graph illustrating a relationship between an amount of beam deviation and positional deviation between a chip and a lens.

FIG. 9B is a graph illustrating a relationship of the amount (mm) of positional deviation in the horizontal direction between the chip 101 including the device generating terahertz waves and the lens of the lens unit 121, with the amount (m) of deviation between the beam of terahertz waves at five meters ahead and the optical axis of the lens unit 121. The relationship is calculated under the condition of 36 antennae arranged in an array and the lens unit 121. The positional deviation in the horizontal direction refers to the positional deviation of the chip 101 from the optical axis of the lens unit 121 in the plane perpendicular to the optical axis of the lens unit 121, and the optical axis of the lens unit 121 means a target position irradiated with terahertz waves. As illustrated in FIG. 9B, the amount of the positional deviation smaller than or equal to 1 mm brings the deviation of the optical axis to about 0.5 mm or less. In particular, it is suitable that the amount of the deviation falls within 0.4 m, which corresponds to the lateral width of a typical person, in imaging a person as an object using terahertz waves. The amount of the deviation according to the present example embodiment sufficiently meets 0.4 m. As wavelengths of terahertz waves are of the order of sub-millimeters, it is suitable that the amount of deviation of the optical axis falls under the wavelength of terahertz waves or equals to it. Thus, it is suitable that the amount of the positional deviation is smaller than or equal to 1 mm.

As described above, the configuration in the present example embodiment allows the positioning accuracy in the horizontal direction determined by contact to fall in the range from several ten micron meters to several hundred micron meters based on the accuracy of machining the lens unit 121 and the chip 101. That leads the amount of the positional deviation illustrated in FIG. 9B to 1 mm or smaller, allowing a high accuracy mounting of the lens unit 121 and the chip 101, providing a higher directivity of terahertz waves.

Further, the wavelengths of terahertz waves used as electromagnetic waves are of the order of several hundred micron meters. That means that the positioning accuracy determined by contact is smaller than the wavelengths of terahertz waves. This makes it possible to position the chip 101 and the lens unit 121 in the horizontal direction with the optical adjustment of terahertz waves made in the mounting process.

As described above, in the present example embodiment, the first positioning portion 128 is in contact with the second positioning portions 129, which are the four corners of the chip 101 as illustrated in FIG. 1A. FIG. 1C is a cross-sectional view taken along line BB' in FIG. 1A, illustrating the face crossing the two second positioning portions 129 positioned on one diagonal of the chip 101 in FIG. 1A. Those illustrate an example of all of the four second positioning portions 129 of the chip 101 in contact with the first positioning portion 128 of the recessed portion 126; however, not all of the four second positioning portions 129 may be in contact with the first positioning portion 128. For example, three second positioning portion 129 may be in contact with the first positioning portion 128 except the rest chamfered corner of them, which is out of contact with the first positioning portion 128. Positioning of the chip 101 and the lens unit 121 at three points enables positioning determined by contact. The clearance between the chamfered corner and the first positioning portion 128 contributes to a reduction in risk of damage to the chip 101 due to the first positioning portion 128 being put into contact with the a second positioning portion 129 by extra force in insert of the chip 101 into the recessed portion 126 of the lens unit 121. That further facilitates the mounting of the lens unit 121 to the chip 101.

Next, making alignment in the lens optical axis direction will be described. As illustrated in FIGS. 1B and 1C, a part or the whole of the face 102 of the chip 101 and a part or the whole of the face 124 of the recessed portion 126 are in face contact with each other. The face contact with each other makes it possible to fix the distance between the curved face 122 of the lens unit 121 and the position 141 of the chip 101 where terahertz waves are generated, for example.

Further, it is suitable that the face 123 of the lens unit 121 is positioned between the face 102 and the face 104 of the chip 101. For example, positioning the face 123 of the lens unit 121 outside the face 104 under the face of the substrate is likely to cause errors in the distance between the face 102 of the chip 101 and the curved face 122. Positioning the face 123 between the face 102 and the face 104 allows the lens unit 121 and the chip 101 to be put into face contact with each other with more reliability. This facilitates positioning of the chip 101 and the lens unit 121 in the optical axis direction.

Further, to achieve a more stable positioning of the lens unit 121 and the chip 101, a part or the whole of the gap between the face 123 and the substrate 142 may be filled with an adhesive. In other words, the lens unit 121 is fixed to the substrate 142 by the adhesive. Such a configuration makes it possible to position the chip 101 and the lens unit 121 in the direction of the optical axis 127 of the lens.

Thus, that configuration facilitates positioning of the chip 101 and the lens unit 121 in the optical axis direction.

It is suitable that the shortest distance between the curved face 122 of the lens unit 121 and the face 102 of the chip 101 is $2\lambda$ or more, where $\lambda$ is the wavelength of the terahertz waves. This condition enables terahertz waves generated from the position 141 to be treated as planar waves near the curved face 122. Treating terahertz waves as planar waves makes it possible to apply a method of designing a lens for visible light to the design of the lens unit 121, which facilitates lens design.

With the lens unit 121 made of a resin material, thermo-compression caused by heating the lens unit 121 after the lens unit 121 and the chip 101 are positioned in place causes the lens unit 121 to be fixed to the chip 101.

The configuration according to the present example embodiment provides the electromagnetic wave module 100 with the lens unit 121 and the chip 101 aligned with high accuracy in the horizontal direction to the optical axis 127 of the lens. Further, the configuration according to the present example embodiment provides the electromagnetic wave module 100 with the lens unit 121 and the chip 101 aligned with high accuracy in the direction of the optical axis 127 of the lens. In particular, the configuration is remarkably effective in reduction of the optical deviation in the mounting process in a band of wavelengths longer than the wavelength of the visible light, such as terahertz waves.

Further, the following effects are expected using terahertz waves as electromagnetic waves. The beam of terahertz waves can be adjusted both with a plurality of antennae and with the lens unit 121, which enhances the flexibility of adjustment of the directivity and the beam shape of terahertz waves. More specifically, to further improve the directivity of terahertz waves, the lens unit 121 is provided in addition to the application of the above-described antenna array arrangement technique. Such a configuration enhances the flexibility of adjustment of the directivity and the beam shape of terahertz waves.

The following is design examples of the lens unit 121 in the electromagnetic wave module 100 described in the present example embodiment. The descriptions of the parts common to the above-described parts will be omitted. However, the configuration of the electromagnetic wave module of the present invention is not limited thereto.

Figure 8:
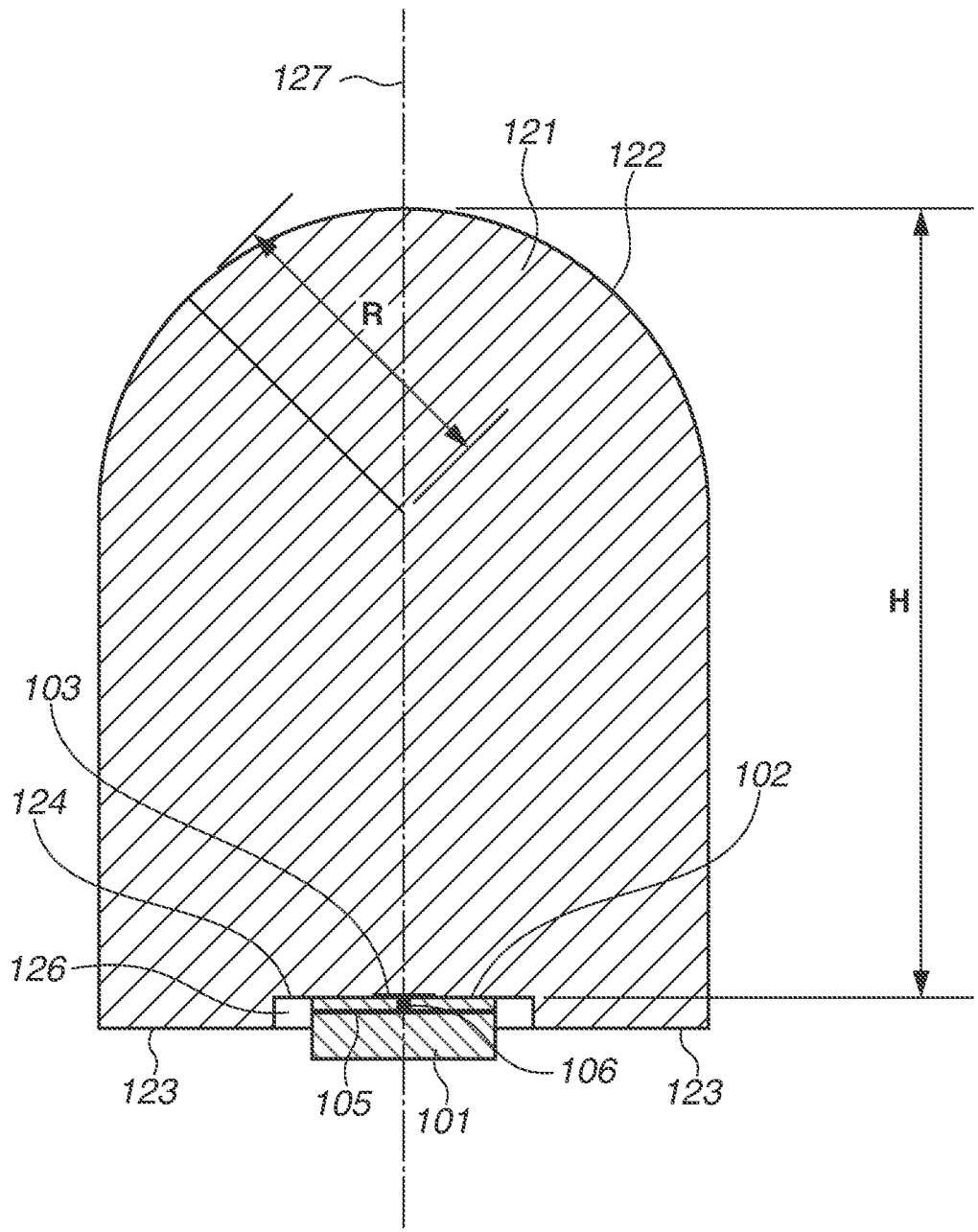
FIG. 8 illustrates a design example of the lens unit of the electromagnetic wave module according to the first example embodiment.

FIG. 8 illustrates a design example of the lens unit of the electromagnetic wave module according to the first example embodiment. The configuration illustrated in FIG. 8 corresponds to the configuration illustrated in FIG. 1B, and the chip 101 and the lens unit 121 are arranged in the manner the same as the arrangement in FIG. 1B.

In FIG. 8, electromagnetic waves are terahertz waves, and the semiconductor portion 106 includes an RTD. The antenna electrode 103 is a rectangular electrode as illustrated in FIG. 1A, and functions as a patch antenna in a combination with the reference portion 105. The RTD is positioned between the antenna electrode 103 serving as the electrode of the patch antenna and the reference portion 105. The device in this case is an active antenna terahertz-wave generation device including the antenna having such a configuration. The terahertz-wave generation device includes 25 antennae arranged in a two-dimensional array, and synchronizes the phases of terahertz waves from the individual antennae (not illustrated). For example, Japanese Patent Application Laid-Open No. 2014-200065 discusses a configuration example of the terahertz-wave generation device. The chip 101 is cut out to have a size of 3 mm×3 mm. The chip 101 has a thickness between 600 μm and 650 μm.

The lens unit 121 is made of high-density polyethylene. The recessed portion 126 provided in the lens unit 121 has a columnar shape in the face 123 of the lens unit 121. The optical axis 127 of the lens unit 121 is coincident with the center axis of the column. The recessed portion 126 has a depth of, for example, 0.5 mm. The column has a diameter of, for example, 4.3 mm. The positional relationship between the chip 101 and the lens unit 121 in this example is the same as the positional relationship in FIGS. 1A to 1C. As illustrated in FIG. 1A, the four corners of the chip 101 serving as the second positioning portions 129 are in contact with the face 125 of the recessed portion 126 serving as the first positioning portion 128.

In FIG. 8, a curvature R of the curved face 122 of the lens unit 121 is, for example, 5 mm. Further, a distance H from the first face 102 of the chip 101 to the curved face 122 of the lens unit 121 is, for example, 12.9 mm.

Such a configuration with the chip 101 and the lens unit 121 mounted in place with high positional accuracy allows suitable terahertz waves to be emitted. In particular, the effect of the antenna arrangement in an array of the chip 101 narrows the radiation angle of terahertz waves down to about 18 degrees. Further, the effect of the lens of the lens unit 121 narrows the radiation angle of terahertz waves further down to about 2.5 degrees. That design achieves a beam width of terahertz waves at five meters ahead of about 0.2 m, a value lower than a suitable amount of the deviation of 0.4 m as described above. The beam adjustment with both a plurality of antennae and the lens makes it possible to improve the flexibility of adjustment of the directivity and the beam shape of terahertz waves.

An electromagnetic wave module according to a second example embodiment will be described with reference to FIGS. 2A and 2B and FIGS. 3A and 3B. In the present example embodiment, some modifications will be described of the planar shape of the recessed portion 126 and the shape in a planar view of the chip 101 according to the first example embodiment. FIGS. 2A and 2B and FIGS. 3A and 3B are projected views in the optical axis direction of the lens unit 121, corresponding to FIG. 1A. The descriptions of the parts common to the above-described parts will be omitted.

Figure 2A:
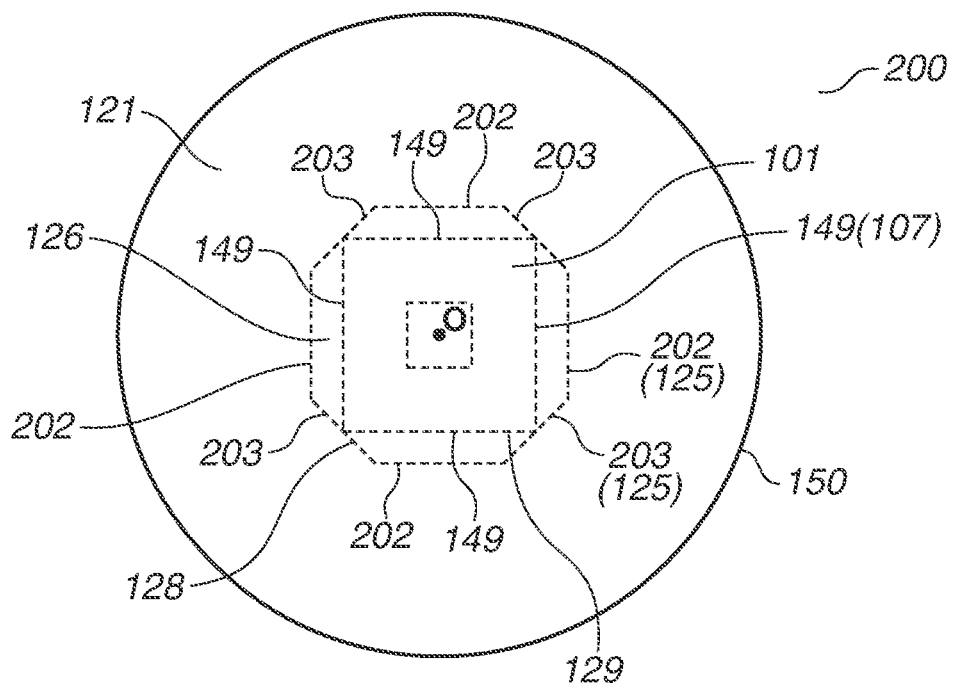
FIGS. 2A and 2B are schematic diagrams each illustrating the configuration of an electromagnetic wave module according to a second example embodiment.

FIG. 2A is a schematic plan view illustrating the configuration of an electromagnetic wave module 200 according to the present example embodiment. In the electromagnetic wave module 200, the recessed portion 126 has an octagonal prism shape. Alternatively, the recessed portion 126 has a shape in which the corners of a quadrangular prism are chamfered. In other words, the recessed portion 126 has an octagonal shape in a planar view as illustrated in FIG. 2A, and has eight sides of four sides 202 and four sides 203. The shape of the recessed portion 126 can be regarded as a shape with eight faces 125 as side faces of the recessed portion 126 illustrated in FIG. 1B. The sides 202 and the sides 203 in FIG. 2A are flat faces corresponding to the side faces of an octagonal prism shape. The shape of the recessed portion 126 is not limited to the octagonal prism shape, and may have another polygonal prism shape.

The first positioning portions 128 included in the recessed portion 126 are a part or the whole of the sides 203, the chamfered corners of the above-described quadrangular prism. The second positioning portions 129 included in the chip 101 are the corners of the chip 101, the sides formed on the faces 107 of the chip 101 as in the first example embodiment. Each of the first positioning portions 128 and the corresponding second positioning portion 129 are in point or line contact with each other. In this case, each of the faces 125 including the first positioning portion 128 is described in a flat face, or a flat plane; however, each of the faces 125 may not be a flat face or a flat plane. For example, the faces 125 including the first positioning portion 128 may include a curved face or a combination of a flat face and a curved face.

Figure 2B:
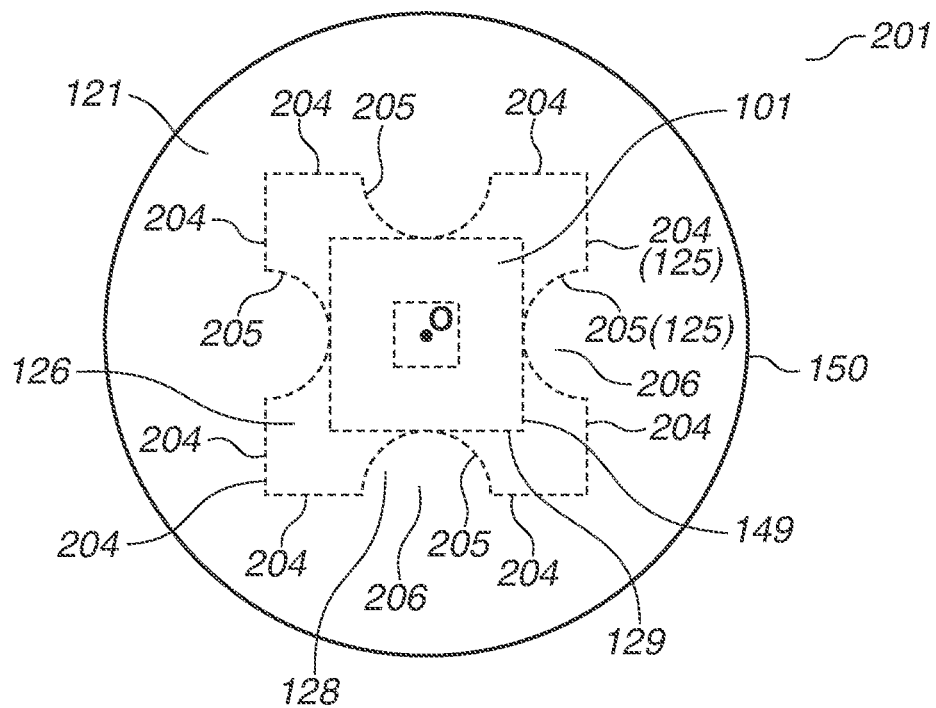

FIG. 2B is a schematic plan view illustrating the configuration of an electromagnetic wave module 201 according to the present example embodiment. The descriptions of the chip 101 and the second positioning portions 129 will be omitted because the chip 101 and the second positioning portions 129 are similar to other examples. The recessed portion 126 has sides 204 in quadrangular shapes and sides 205 continuing from the sides 204. The sides 205 are curved semicircular sides, and forms convex portions 206. The first positioning portions 128 included in the recessed portion 126 are the sides 205 as the convex portions 206. In a stereoscopic view, each of the sides 205 is a side face of a semicircular column. However, the shape of the sides 205 is not limited thereto and the sides 205 may be a side face of a prism. Further, the convex portions 206 formed by the sides 205 each have a curved face; however, each of the convex portions 206 may have a plurality of flat faces or a combination of a curved face and a flat face. The second positioning portions 129 are the faces 107 of the chip 101. Each of the first positioning portions 128 and the corresponding second positioning portion 129 is in point or line contact with each other. As described in the first example embodiment, the contact method of the first positioning portions 128 and the second positioning portions 129 is not limited thereto. For example, each of the first positioning portions 128 and the corresponding second positioning portion 129 may be in face contact with each other.

Figure 3A:
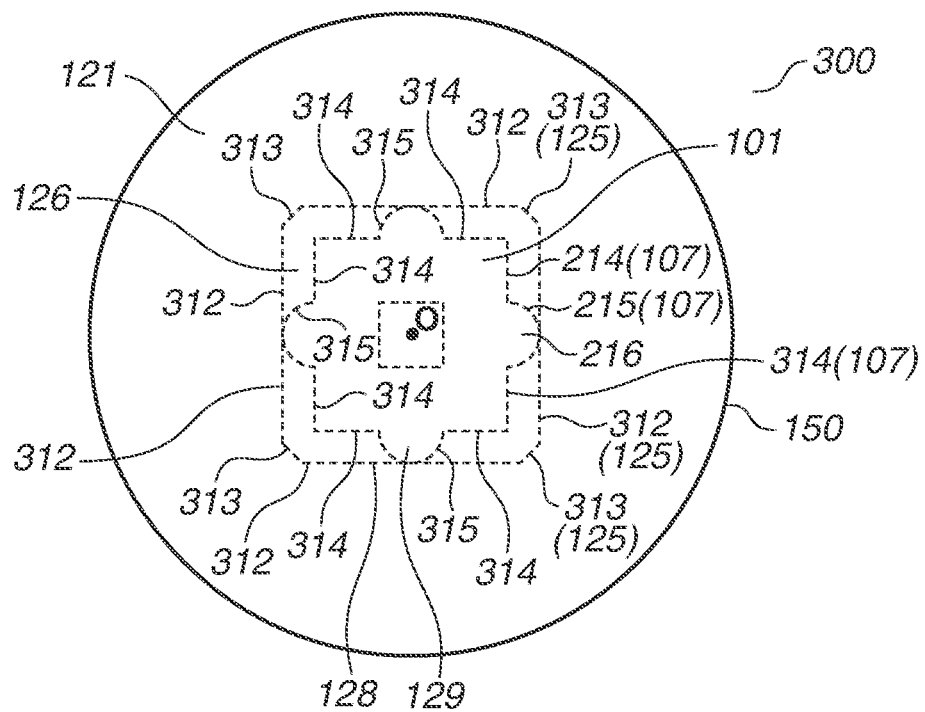
FIGS. 3A and 3B are schematic diagrams each illustrating another configuration of the electromagnetic wave module according to the second example embodiment.

FIG. 3A is a schematic plan view illustrating the configuration of an electromagnetic wave module 300 according to the present example embodiment. The recessed portion 126 has a quadrangular shape as illustrated in FIG. 3A. The recessed portion 126 in FIG. 3A is smaller in chamfered portions than the quadrangular shape in FIG. 2A. The recessed portion 126 in a stereoscopic view can have a shape as a quadrangular prism shape. Alternatively, the recessed portion 126 may have a quadrangular prism shape with an unchamfered corner, and may have another polygonal prism shape. The recessed portion 126 has four sides 312 and four sides 313. The sides 313 are chamfered portions. The first positioning portions 128 are the sides 312 in FIG. 3A. In other words, the first positioning portions 128 are the faces 125 as the side faces of the quadrangular prism shape. Each of the faces 125 may be a curved face or a combination of a curved face and a flat face.

In FIG. 3A, the chip 101 has four side 314 and sides 315 continuing from the sides 314. The sides 315 are curved semicircular sides. The sides 315 are semicircular convex portions 216. Each of the convex portions 216 in a stereoscopic view is a semi-columnar protrusion; however, each of the convex portions 216 may have a polygonal prism shape or a columnar shape with a combination of a curved face and a flat face. Each of the second positioning portions 129 can be regarded as a protrusion. In FIG. 3A, each of the first positioning portions 128 and the corresponding second positioning portion 129 is in point or line contact with each other. As described above, the contact method of the first positioning portions 128 and the second positioning portions 129 is not limited thereto. For example, each of the first positioning portions 128 and the corresponding second positioning portion 129 may be in face contact with each other.

Figure 3B:
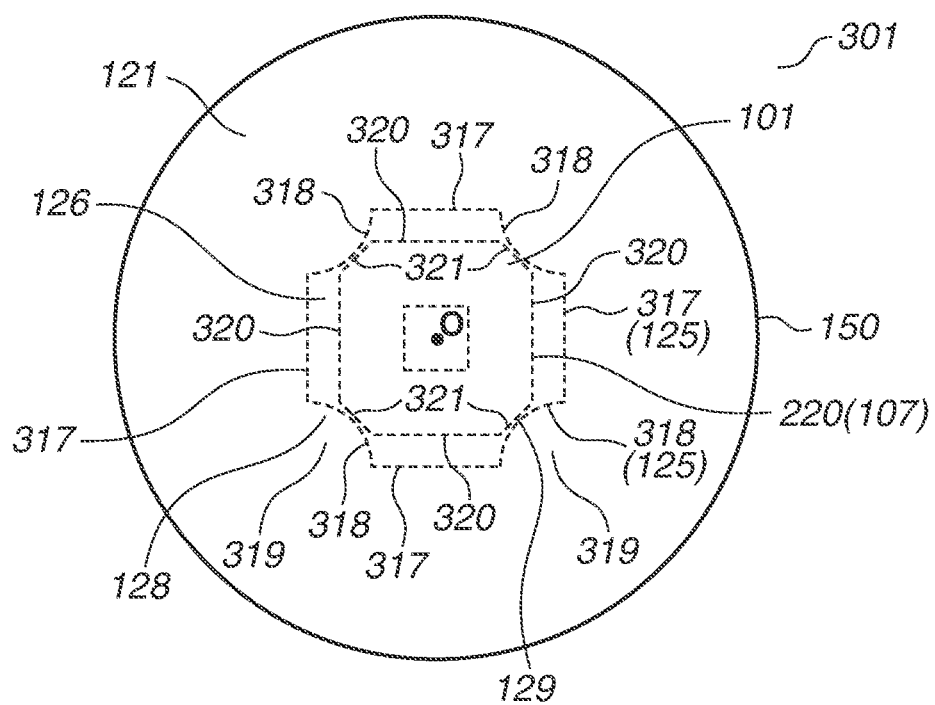

FIG. 3B is a schematic plan view illustrating the configuration of an electromagnetic wave module 301 according to the present example embodiment. The recessed portion 126 has a quadrangular shape. More specifically, the recessed portion 126 has four sides 317 and sides 318 continuing from the sides 317. The sides 318 are four chamfered corners, and are convex portions 319 curved toward the inside of the recessed portion 126. Each of the convex portions 319 in a stereoscopic view has a columnar shape, and has a side face projecting toward the inside of the recessed portion 126. The projected side face has a curved face. The first positioning portions 128 are a part or all of the convex portions 319 of the recessed portion 126.

In FIG. 3B, the chip 101 has a quadrilateral shape with chamfered corners.

The chip 101 has four sides 320 and four sides 321 continuous from the sides 320. The sides 321 are chamfered portions. In a stereoscopic view, the sides 320 and the sides 321 are the faces 107 as the side faces of the chip 101. The second positioning portions 129 are the sides 321.

Each of the faces 107 may be a flat face or a curved face. In FIG. 3B, each of the first positioning portions 128 and the corresponding second positioning portion 129 is in point or line contact with each other. As described above, the contact method of the first positioning portions 128 and the second positioning portions 129 is not limited thereto. For example, each of the first positioning portions 128 and the corresponding second positioning portion 129 may be in face contact with each other.

As described in the present example embodiment, the configurations of the first positioning portions 128 and the second positioning portions 129 can be variously modified, and are not limited to the configurations described in the present example embodiment as long as the positioning can be achieved by contact between the recessed portion 126 and the chip 101.

The above-described configurations in the electromagnetic wave module according to the present example embodiment allow the lens unit 121 and the chip 101 to be positioned in place while terahertz waves are optically adjusted in the horizontal direction to the optical axis 127 of the lens. Thus, the configurations provide the electromagnetic wave module with the lens unit 121 and the chip 101 positioned with high accuracy.

Figure 4A:
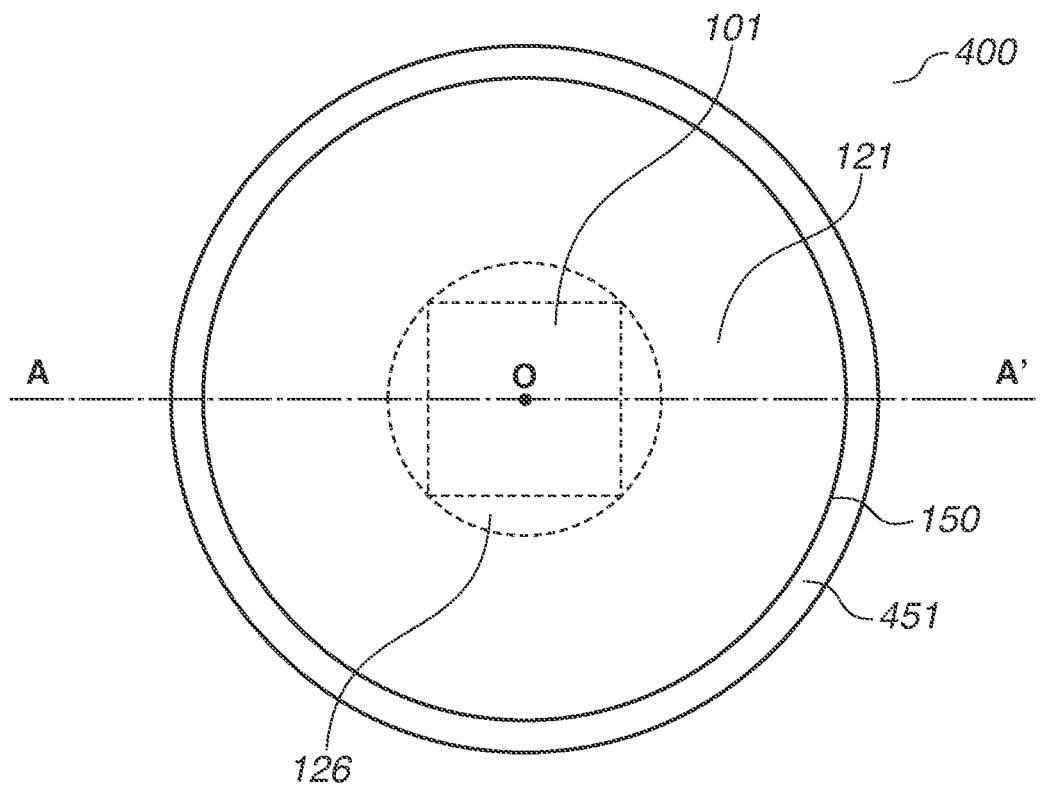
FIGS. 4A and 4B are schematic diagrams each illustrating the configuration of an electromagnetic wave module according to a third example embodiment.
Figure 4B:
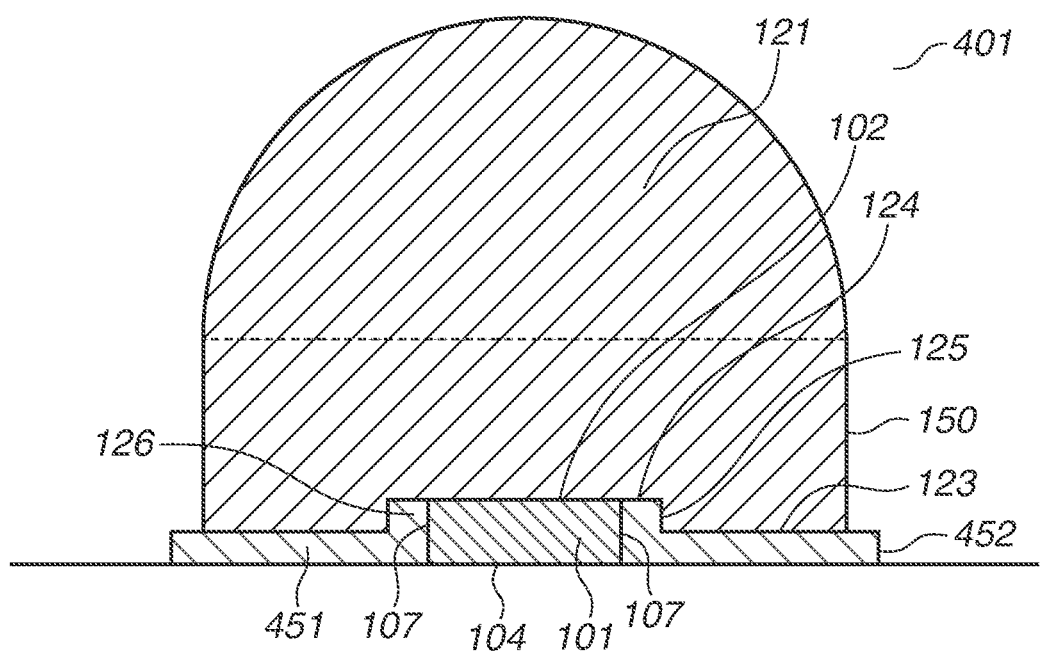

An electromagnetic wave module 400 according to a third example embodiment will be described with reference to FIGS. 4A and 4B. In the present example embodiment, how to fix the chip 101 and the lens unit 121 is modified from the first example embodiment. FIG. 4A is a schematic plan view illustrating a configuration of the electromagnetic wave module 400. FIG. 4B is a schematic cross-sectional view taken along line AA' in FIG. 4A, illustrating the configuration of the electromagnetic wave module 400. FIG. 4A is also a projected view in the optical axis direction of the lens unit 121. FIG. 4B is also a cross-sectional view in the optical axis direction of the lens unit 121. FIG. 4A is a schematic diagram corresponding to FIG. 1A, and FIG. 4B is a schematic diagram corresponding to FIG. 1B. The descriptions of the parts common to the above-described parts will be omitted.

The electromagnetic wave module 400 includes an organic material layer 451. In FIG. 4A, the organic material layer 451 is positioned outside the lens unit 121. The outer edge of the recessed portion 126, the outer edge 150 of the lens unit 121, and an outer edge 452 of the organic material layer 451 are concentric with the point O as the center.

In FIG. 4B, the organic material layer 451 is positioned between the lens unit 121 and the substrate 142, and the gap between the recessed portion 126 of the lens unit 121 and the chip 101 is filled with the organic material layer 451. Further, the organic material layer 451 is positioned between the face 123 of the lens unit 121 and the substrate 142, is positioned between the chip 101 and the face 125 of the recessed portion 126, and is positioned between the face 124 of the recessed portion 126 and the substrate 142. The organic material layer 451 is in contact with the substrate 142, the faces 107 of the chip 101, the face 123 of the lens unit 121, and the face 124 of the recessed portion 126. In other words, the inside of the recessed portion 126 and the gap between the face 123 of the lens unit 121 and the substrate 142 are filled with the organic material layer 451. As the organic material layer 451, for example, an adhesive, a matching oil, or a resin is applicable, and the organic material layer 451 contains at least one thereof. The gap between the lens unit 121 and the substrate 142 is entirely filled with the organic material layer 451, but may be partially filled with the organic material layer 451. For example, the organic material layer 451 may be positioned between the face 123 of the lens unit 121 and the substrate 142 with gas filled in the gap between the faces 107 of the chip 101 and the face 125 of the recessed portion 126. Further, the organic material layer 451 may include a spacer made of an organic material.

In the configuration, the gap between the substrate 142, the chip 101, and the lens unit 121 is filled with the organic material layer 451, providing a better fixation between the chip 101 and the lens unit 121. Further, as compared with the case where the chip 101 is surrounded by atmospheric air, the tight contact between the chip 101 and the organic material layer 451 offers a higher thermal conductivity in the thermal path between the chip 101 and the outside. Thus, that enables effective dissipation of heat generated from the chip 101, which makes it easy to protect the chip 101.

Figure 5A:
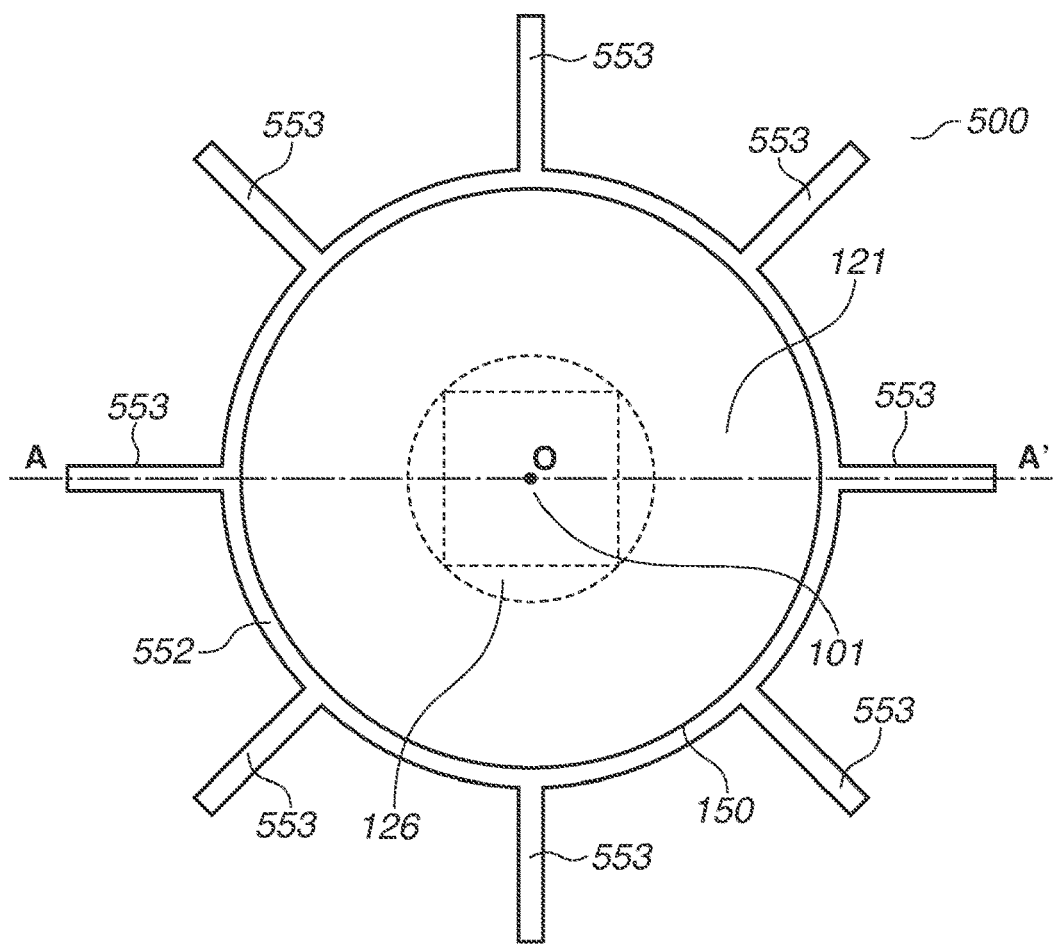
FIGS. 5A and 5B are schematic diagrams each illustrating the configuration of an electromagnetic wave module according to a fourth example embodiment.
Figure 5B:
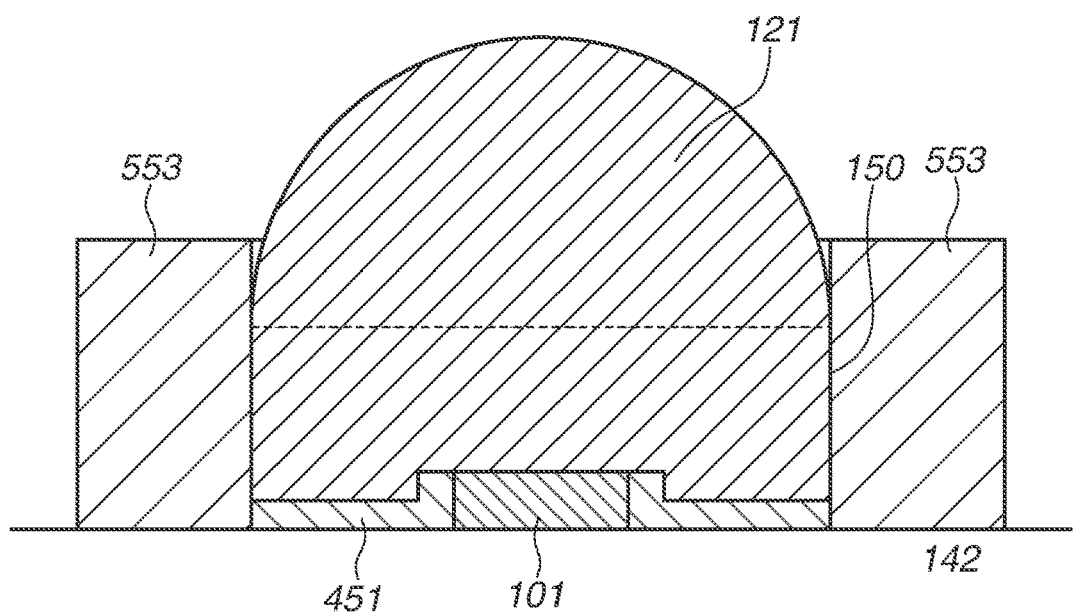

An electromagnetic wave module 500 according to a fourth example embodiment will be described with reference to FIGS. 5A and 5B. In the present example embodiment, a heat dissipation configuration is added to the configuration according to the third example embodiment. FIG. 5A is a schematic plan view illustrating a configuration of the electromagnetic wave module 500. FIG. 5B is a schematic cross-sectional view taken along line AA' in FIG. 5A, illustrating the configuration of the electromagnetic wave module 500. FIG. 5A is also a projected view in the optical axis direction of the lens unit 121. FIG. 5B is also a cross-sectional view in the optical axis direction of the lens unit 121. FIG. 5A is a schematic diagram corresponding to FIG. 4A, and FIG. 5B is a schematic diagram corresponding to FIG. 4B. The descriptions of the parts common to the above-described parts will be omitted.

As illustrated in FIG. 5A, the electromagnetic wave module 500 includes a heat dissipation portion 552 disposed outside the outer edge 150 of the lens unit 121. The heat dissipation portion 552 is made of a substance high in thermal conductivity, and for example, contains aluminum, copper, a material containing aluminum as a main component, or a material containing copper as a main component. The thermal conductivity of the heat dissipation portion 552 is suitably higher than the thermal conductivity of the lens unit 121. The heat dissipation portion 552 further includes a plurality of fins 553 as a heat dissipation configuration to enhance the thermal conductivity. The heat dissipation configuration of the heat dissipation portion 552 is not limited to the fins 553, and can be a configuration such as a configuration to increase the face area. Heat generated from the chip 101 is transferred to the heat dissipation portion 552 through the lens unit 121 and the organic material layer 451, and is efficiently dissipated to the outside. Thus, that reduces the risk of thermal breakage of the chip 101 to protect the chip 101. Further, the lens unit 121 is positioned by the heat dissipation portion 552, providing a better fixation between the chip 101 and the lens unit 121, which enables the mounting with high positional accuracy.

Figure 6A:
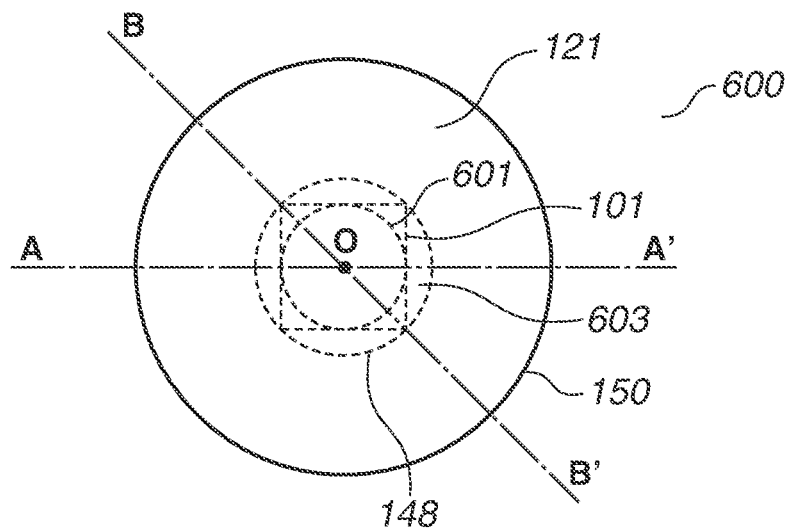
FIGS. 6A to 6C are schematic diagrams each illustrating the configuration of an electromagnetic wave module according to a fifth example embodiment.
Figure 6B:
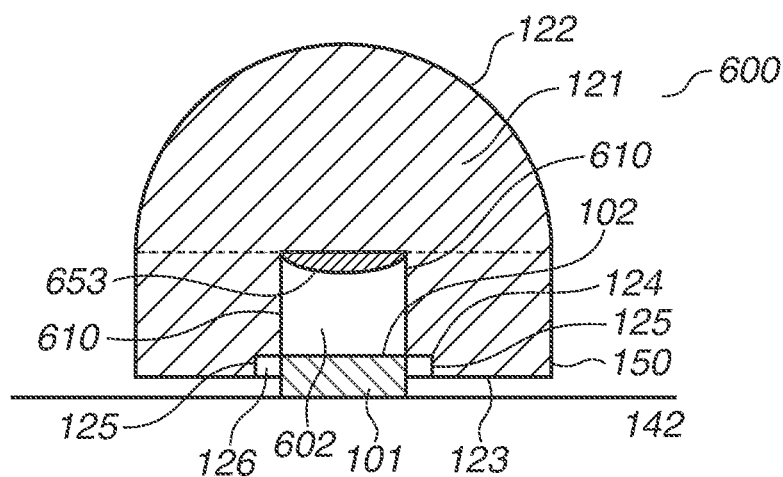
Figure 6C:
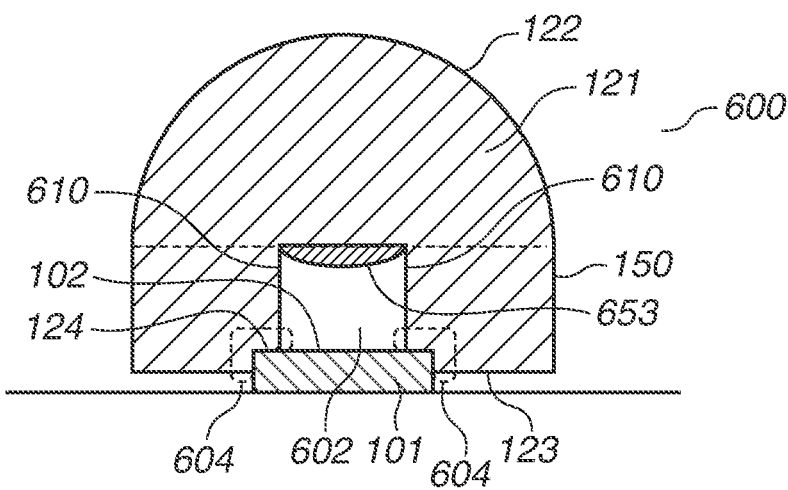

An electromagnetic wave module 600 according to a fifth example embodiment will be described with reference to FIGS. 6A to 6C. In the present example embodiment, the configuration of the recessed portion 126 of the lens unit 121 is modified from the first example embodiment. FIG. 6A is a schematic plan view illustrating a configuration of the electromagnetic wave module 600. FIG. 6B is a schematic cross-sectional view taken along line AA' in FIG. 6A, illustrating the configuration of the electromagnetic wave module 600. FIG. 6C is a schematic cross-sectional view taken along line BB' in FIG. 6A, illustrating the configuration of the electromagnetic wave module 600. FIG. 6A is also a projected view in the optical axis direction of the lens unit 121. FIGS. 6B and 6C are also cross-sectional views in the optical axis direction of the lens unit 121. FIG. 6A is a schematic diagram corresponding to FIG. 1A, FIG. 6B is a schematic diagram corresponding to FIG. 1B, and FIG. 6C is a schematic diagram corresponding to FIG. 1C. The descriptions of the parts common to the above-described parts will be omitted.

As illustrated in FIG. 6A, the lens unit 121 has a portion 601. The portion 601 is inside the recessed portion 126 and has a circular shape in a planar view. The outer edge of the portion 601, the outer edge 150 of the lens unit 121, and the outer edge 148 of the recessed portion 126 are concentric with the point O as the center. The portion between the outer edge 148 of the recessed portion 126 and the portion 601 is referred to as a portion 603.

As illustrated in FIGS. 6B and 6C, the portion 601 has a face 653. The face 653 is positioned between the recessed portion 126 and the face 122. The face 653 is a curved face and can function as a lens. A portion 602 is disposed between the lens unit 121 and the chip 101. The portion 602 is a space that contains gas. The space may be an air gap. The gas is atmospheric air or inert gas. The portion 602 has a face 610 as the side face.

As illustrated in FIG. 6A, the face 610 is a curved face; however, the face 610 is not limited thereto, and may be a flat face. The face 122 and the face 653 form a biconvex lens. The shape of the lens shaped by the face 653 is not limited thereto, and the face 653 may form a convex lens. Further, a plurality of faces 653 may be included therein. The faces 653 may be arranged in the horizontal direction to form a plurality of lenses.

As illustrated in FIGS. 6B and 6C, the face 124 as the upper face of the recessed portion 126 is in contact with the four corners of the face 102 as the upper face of the chip 101, which can function as positioning portions for the lens unit 121 and the chip 101. Further, at least a part of the portion 603 illustrated in FIG. 6A is in contact with the face 102 of the chip 101 illustrated in FIG. 6C, thereby aligning the chip 101 and the lens unit 121 in the horizontal direction and the perpendicular direction. In other words, a recessed portion 604 illustrated in FIG. 6C can function as the first positioning portion 128. The recessed portion 604 is a portion positioned between the face 610 and the face 123.

The lens unit 121 may be fabricated of a plurality of divided blocks that are molded and finally bonded together. Alternatively, the lens unit 121 with a plurality of curved faces may be integrally fabricated by using a three-dimensional (3D) printer.

In the present example embodiment, the lens unit 121 has a plurality of curved faces, providing higher flexibility of adjustment of the beam of electromagnetic waves by the lens.

Figure 7A:
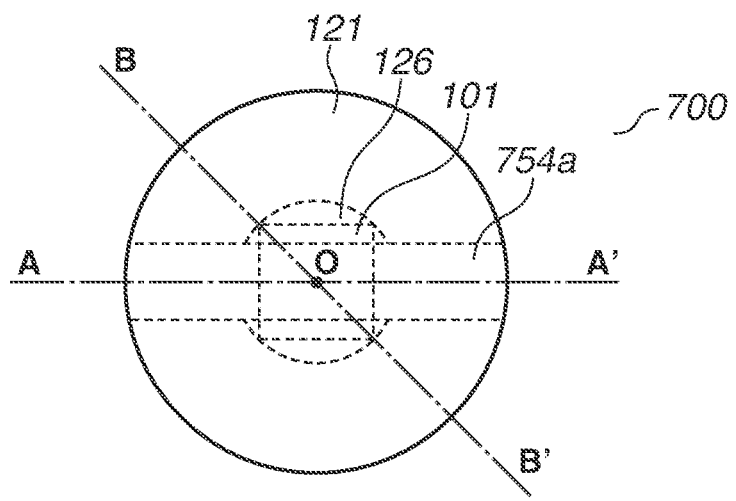
FIGS. 7A to 7D are schematic diagrams each illustrating the configuration of an electromagnetic wave module according to a sixth example embodiment.
Figure 7B:
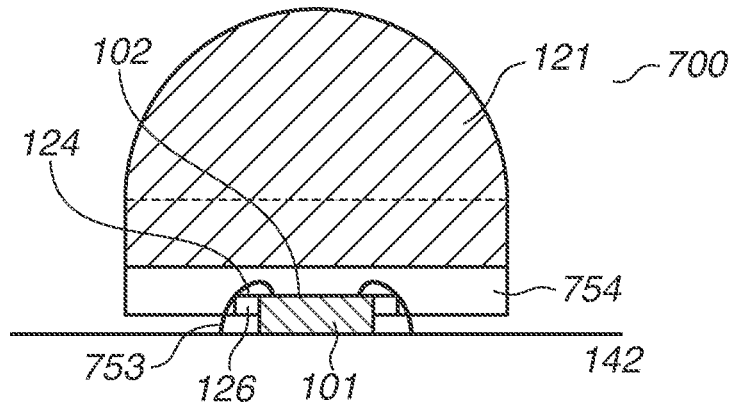
Figure 7C:
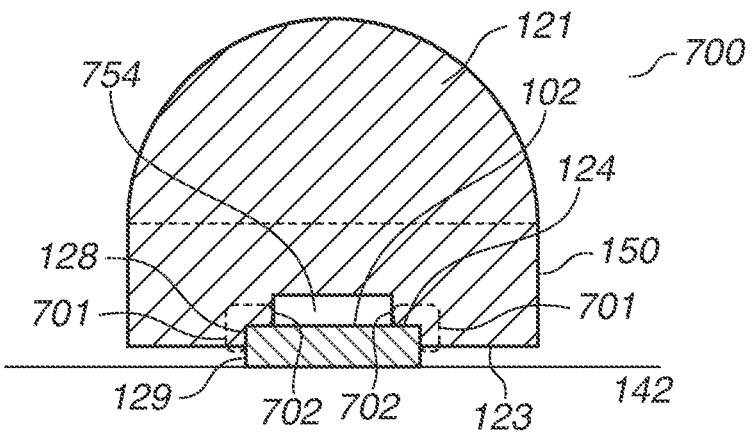
Figure 7D:
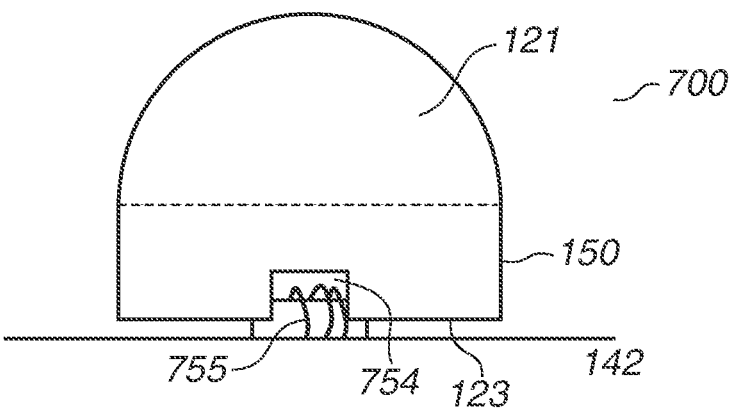

An electromagnetic wave module 700 according to a sixth example embodiment will be described with reference to FIGS. 7A to 7D. In the present example embodiment, the configuration of the recessed portion 126 of the lens unit 121 is modified from the first example embodiment. FIG. 7A is a schematic plan view illustrating a configuration of the electromagnetic wave module 700. FIG. 7B is a schematic cross-sectional view taken along line AA' in FIG. 7A, illustrating the configuration of the electromagnetic wave module 700. FIG. 7C is a schematic cross-sectional view taken along line BB' in FIG. 7A, illustrating the configuration of the electromagnetic wave module 700. FIG. 7D is a schematic side view illustrating the configuration of the electromagnetic wave module 700. FIG. 7A is also a projected view in the optical axis direction of the lens unit 121. FIGS. 7B and 7C are also cross-sectional views in the optical axis direction of the lens unit 121. FIG. 7D is a schematic diagram illustrating the configuration as viewed in the direction perpendicular to the optical axis direction of the lens unit 121. FIG. 7A is a schematic diagram corresponding to FIG. 1A, FIG. 7B is a schematic diagram corresponding to FIG. 1B, and FIG. 7C is a schematic diagram corresponding to FIG. 1C. The descriptions of the parts common to the above-described parts will be omitted.

As illustrated in FIG. 7A, the lens unit 121 has a groove portion 754 in addition to the recessed portion 126. With a component present on the face 102 of the chip 101, the groove portion 754 prevents contact between the component and the lens unit 121. In the present example embodiment, an example is illustrated in which wiring 755 is disposed as an example of the component of the chip 101. As illustrated in FIG. 7D, the wiring 755 in the groove portion 754 can be disposed out of contact with the lens unit 121. As illustrated in FIG. 7A, the groove portion 754 has a belt shape passing through the recessed portion 126. Further, as illustrated in FIG. 7A, the groove portion 754 is line symmetrical about the AA' line passing through the point O, or is line symmetrical about a line perpendicular to the AA' line. For example, as illustrated in FIGS. 7B and 7C, the groove portion 754 is positioned in the face 123 of the lens unit 121 and has a prism shape. The groove portion 754 can be formed by cutting of the face 123. The shape and position of the groove portion 754 are not limited thereto. For example, the groove portion 754 may have a curved face, and a plurality of groove portions 754 may be provided therein. As illustrated in FIG. 7A, the groove portion 754 is provided crossing the face 123 as the bottom face and extending to the outer edge 150 of the lens unit 121; however, the groove portion 754 may be provided away from the outer edge 150 of the lens unit 121. In other words, the groove portion 754 may be encompassed in the lens unit 121.

As illustrated in FIG. 7C, the face 124 of the recessed portion 126 is in contact with the four corners of the face 102 of the chip 101, and can function as a positioning portion for the lens unit 121 and the chip 101. Recessed portions 701 illustrated in FIG. 7C can function as the first positioning portions 128. The recessed portions 701 are positioned between faces 702 forming the groove portion 754 and the face 123.

The configuration allows the chip 101 and the lens unit 121 to be positioned in place even with a component present on the face 124 of the chip 101. This improves flexibility.

A seventh example embodiment will be described. In the present example embodiment, a case will be described where the electromagnetic wave module according to any of the first to sixth example embodiments is used in an electromagnetic wave camera system. In the present example embodiment, a terahertz wave camera system using terahertz waves as electromagnetic waves will be described with reference to FIG. 10. A terahertz wave camera system 1000 includes a transmission unit 1001 emitting terahertz waves, and a reception unit 1002 detecting terahertz waves. The terahertz wave camera system 1000 further includes a control unit 1003 to control operation of the transmission unit 1001 and the reception unit 1002 based on signals from the outside, and processes an image based on the detected terahertz waves or outputs the image to the outside. The electromagnetic wave module according to each of the example embodiments may be used as the transmission unit 1001 or the reception unit 1002.

Terahertz waves from the transmission unit 1001 are reflected by an object 1005, and the reflected terahertz waves are detected by the reception unit 1002. A camera system including the transmission unit 1001 and the reception unit 1002 is also referred to as an active camera system. In a passive camera system without the transmission unit 1001, the electromagnetic wave module according to each of the example embodiments can be used as a reception unit. The electromagnetic wave camera system equipped with the electromagnetic wave module according to each of the example embodiments provides a high detection sensitivity and images with high quality.

The present invention is not limited to the above-described example embodiments, and can be variously modified and alternated within the scope of the gist of the present invention.

While example embodiments have been described, it is to be understood that the invention is not limited to the disclosed example embodiments. The scope of the following claims is to be accorded the broadest interpretation so as to encompass all such modifications and equivalent structures and functions.

This application claims the benefit of Japanese Patent Application No. 2020-198281, filed Nov. 30, 2020, which is hereby incorporated by reference herein in its entirety.

What is claimed is:

1. An electromagnetic wave module comprising a chip and a lens unit,
   wherein the chip has a first face, a second face opposed to the first face, and a third face connecting the first face and the second face,
   wherein the chip at least includes an antenna electrode disposed on the first face, a reference portion disposed on the second face and configured to determine a reference potential, and a semiconductor portion disposed between the antenna electrode and the reference portion and configured to perform gain action or rectification action on electromagnetic waves,
   wherein the lens unit has a curved face forming a lens, a fourth face opposed to the curved face, and a recessed portion encompassed in an outer edge of the curved face on a projected plane in an optical axis of the lens,
   wherein the recessed portion has a fifth face disposed at a position closer to the curved face than the fourth face, and a sixth face connecting the fifth face and the fourth face, and
   wherein at least a part of the sixth face of the recessed portion is in contact with at least a part of the third face of the chip.

2. The electromagnetic wave module according to claim 1, wherein at least a part of the sixth face serves as a first positioning portion provided on a part or whole of the sixth face.

3. The electromagnetic wave module according to claim 1, wherein at least a part of the third face serves as a second positioning portion provided on a part or whole of the third face.

4. The electromagnetic wave module according to claim 1,
   wherein at least a part of the sixth face serves as a first positioning portion provided on a part or whole of the sixth face,
   wherein at least a part of the third face serves as a second positioning portion provided on a part or whole of the third face, and
   wherein the first positioning portion and the second positioning portion are in contact with each other.

5. The electromagnetic wave module according to claim 4, wherein a first distance between a first position where the first positioning portion and the second positioning portion are in contact with each other and a second position where the electromagnetic waves are transmitted or received is equal to a second distance between the first position and an optical axis of the lens.

6. The electromagnetic wave module according to claim 1, wherein a part or whole of the first face of the chip is in contact with the fifth face of the recessed portion.

7. The electromagnetic wave module according to claim 1, wherein the fourth face of the lens unit is positioned between the first face and the second face of the chip.

8. The electromagnetic wave module according to claim 1, wherein a shortest distance between the curved face of the lens unit and the first face of the chip is longer or equal to $2\lambda$, where $\lambda$ is a wavelength of the electromagnetic waves.

9. The electromagnetic wave module according to claim 1, further comprising:
   a substrate on which the chip and the lens unit are mounted; and
   an organic material layer configured to be in contact with the substrate, the third face of the chip, and the fourth face of the lens unit.

10. The electromagnetic wave module according to claim 1, further comprising a heat dissipation portion disposed on the outer edge face of the lens unit.

11. The electromagnetic wave module according to claim 1, wherein the lens unit is a convex lens having a curved face convex in a direction away from the fourth face.

12. The electromagnetic wave module according to claim 1, wherein the lens unit has a semicircular shape in a cross-sectional view along the optical axis.

13. The electromagnetic wave module according to claim 1, wherein the semiconductor portion includes a plurality of antenna electrodes.

14. The electromagnetic wave module according to claim 1,
   wherein the semiconductor portion includes a negative resistance device, and
   wherein the lens unit is made of any of a material containing polyolefin as a main component, a material containing Teflon® as a main component, a material containing polyethylene as a main component, or a material containing silicon as a main component.

15. The electromagnetic wave module according to claim 1, wherein the electromagnetic waves are terahertz waves.

16. An electromagnetic wave camera system, comprising:
   the electromagnetic wave module according to claim 1;
   a reception unit configured to detect electromagnetic waves from the electromagnetic wave module; and a control unit configured to control operation of the electromagnetic wave module and the reception unit.

* * * * *